(12) United States Patent
Zhang et al.

(10) Patent No.: US 12,207,396 B2
(45) Date of Patent: Jan. 21, 2025

(54) CIRCUIT BOARD ASSEMBLY WITH REDUCED HEIGHT AND REDUCED WIDTH, CAMERA MODULE HAVING THE CIRCUIT BOARD ASSEMBLY, AND ELECTRONIC DEVICE HAVING THE CAMERA MODULE

(71) Applicant: Rayprus Technology (Foshan) Co., Ltd., Foshan (CN)

(72) Inventors: Han-Ru Zhang, Jincheng (CN); Ke-Hua Fan, Jincheng (CN); Ding-Nan Huang, New Taipei (TW); Long-Fei Zhang, Guangdong (CN)

(73) Assignee: Rayprus Technology (Foshan) Co., Ltd., Foshan (CN)

( * ) Notice: Subject to any disclaimer, the term of this patent is extended or adjusted under 35 U.S.C. 154(b) by 254 days.

(21) Appl. No.: 17/991,746

(22) Filed: Nov. 21, 2022

(65) Prior Publication Data
US 2024/0098888 A1    Mar. 21, 2024

(30) Foreign Application Priority Data

Sep. 19, 2022   (CN) .......................... 202211147765.9

(51) Int. Cl.
*H05K 1/02* (2006.01)
*H04N 23/54* (2023.01)
*H05K 1/11* (2006.01)
*H05K 1/18* (2006.01)

(52) U.S. Cl.
CPC ........... *H05K 1/0271* (2013.01); *H04N 23/54* (2023.01); *H05K 1/0274* (2013.01); *H05K 1/115* (2013.01); *H05K 1/18* (2013.01); *H05K 2201/0154* (2013.01); *H05K 2201/10121* (2013.01); *H05K 2201/10151* (2013.01)

(58) Field of Classification Search
CPC .... H05K 1/0271; H05K 1/0274; H05K 1/115; H05K 1/18; H05K 2201/0154; H05K 2201/10121; H05K 2201/10151; H04N 23/54
USPC ......................................................... 361/760
See application file for complete search history.

(56) References Cited

U.S. PATENT DOCUMENTS

2010/0103296 A1\* 4/2010 Nakagiri ................ H04N 23/57
257/E31.127

FOREIGN PATENT DOCUMENTS

TW            202024765 A      7/2020

\* cited by examiner

*Primary Examiner* — Binh B Tran
(74) *Attorney, Agent, or Firm* — ScienBiziP, P.C.

(57) ABSTRACT

A circuit board assembly with a fully embedded photosensitive chip which does not require an increase in board width for the re-routing of wires around the photosensitive chip includes a circuit board and a reinforced plate at a lower elevation which is connected to the circuit board. The circuit board defines a through hole and a plurality of conductive lines. The conductive lines or the portion of them which are cut off by the location of the through hole accommodating the chip are repeated by connecting lines carried on the reinforced plate, the plurality of connecting lines connects to and continues the conductive lines which are cut off by the hole.

20 Claims, 6 Drawing Sheets

CIRCUIT BOARD ASSEMBLY WITH REDUCED HEIGHT AND REDUCED WIDTH, CAMERA MODULE HAVING THE CIRCUIT BOARD ASSEMBLY, AND ELECTRONIC DEVICE HAVING THE CAMERA MODULE

FIELD

The subject matter herein generally relates to circuit board construction, especially to a circuit board assembly, a camera module having the circuit board assembly, and an electronic device having the camera module.

BACKGROUND

A camera module generally includes a circuit board and a photosensitive chip connected to the circuit board. In order to reduce an overall height of the camera module, the photosensitive chip is designed to be embedded in the circuit board. Thus, an opening to accommodate the photosensitive ship may be needed in the circuit board, and the photosensitive chip is electrically connected to the circuit board through wire bonding.

However, wiring and conductive lines of the circuit board need to be away from the opening, so the location and the size of the opening may alter the original distribution of the conductive lines. Thus, the circuit board may need to become wider to adapt to the altered conductive lines, which is not conducive to the miniaturization of the camera module.

BRIEF DESCRIPTION OF THE DRAWINGS

Implementations of the present technology will now be described, by way of example only, with reference to the attached figures.

DETAILED DESCRIPTION

Figure 1:
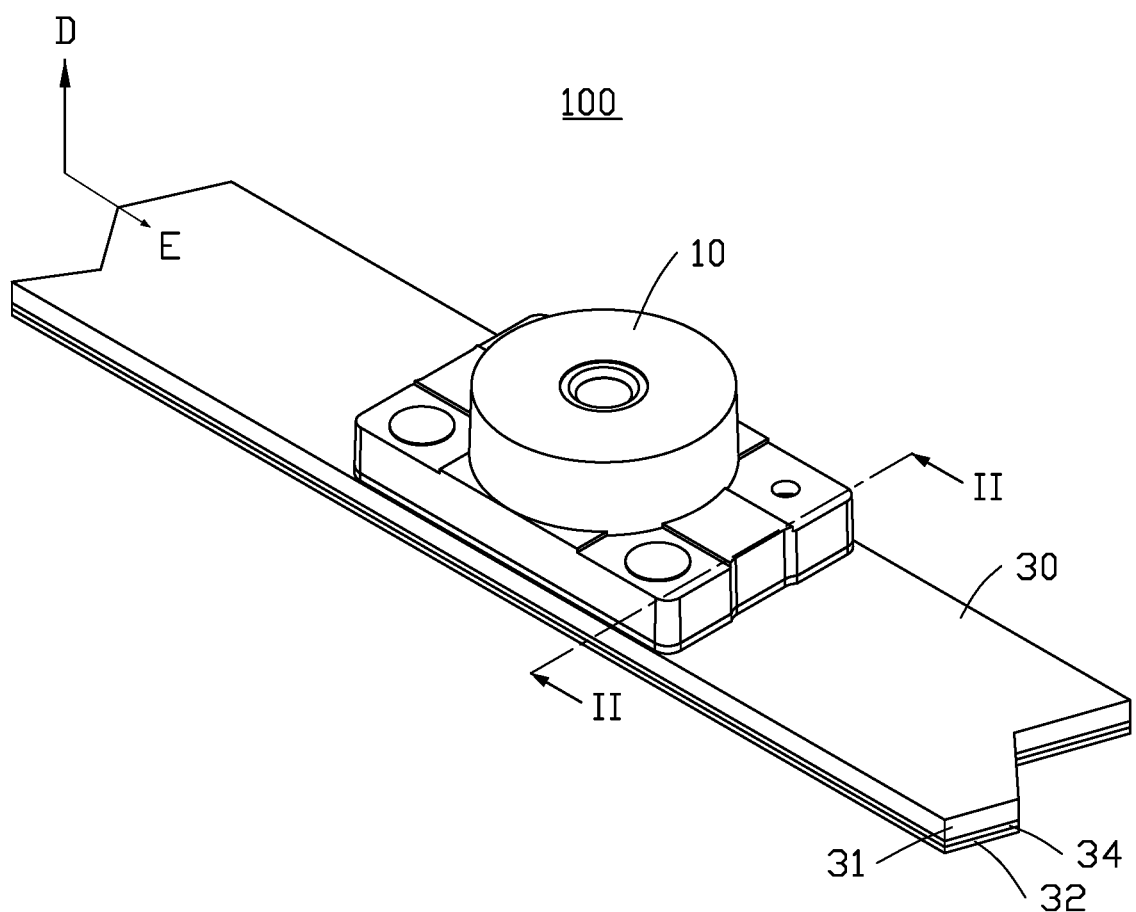
FIG. 1 is a diagrammatic view of a camera module according to an embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
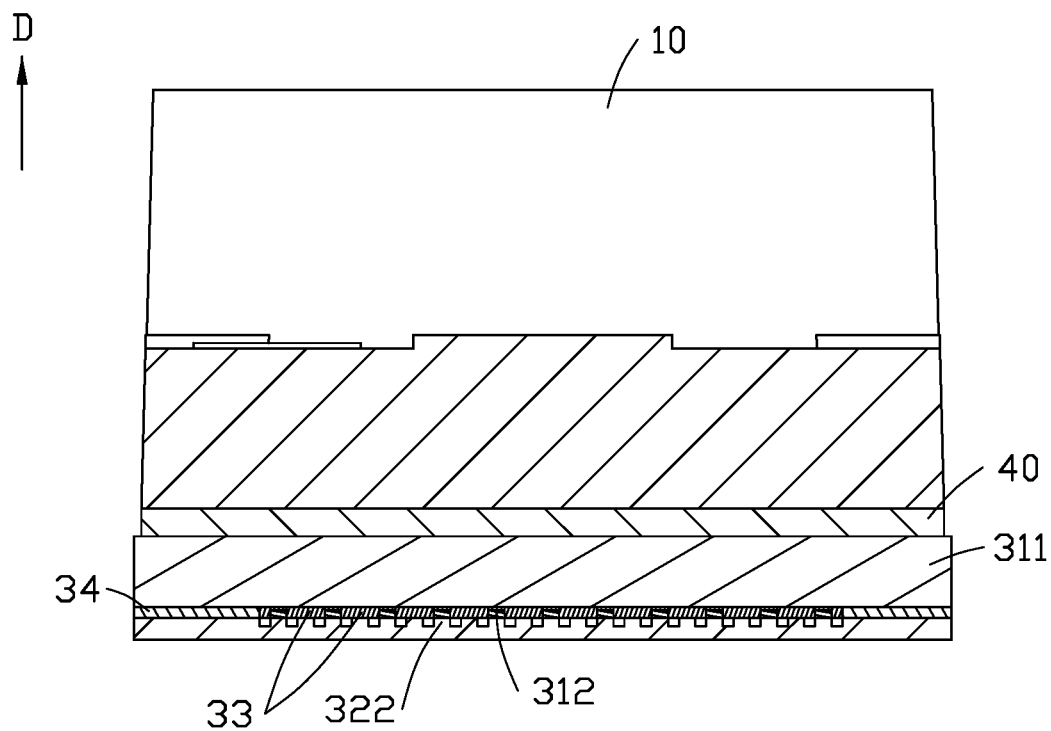
FIG. 2 is a cross-sectional view along line II-II of FIG. 1.

Referring to FIGS. 1 and 2, an embodiment of the present disclosure provides a camera module 100. The camera module 100 includes a lens assembly 10, a photosensitive chip 20, and a circuit board assembly 30. The lens assembly 10 is arranged on the circuit board assembly 30. The photosensitive chip 20 is disposed within the circuit board assembly 30. In at least one embodiment, the photosensitive chip 20 may be a charge-coupled device (CCD) or an active-pixel sensor of the CMOS type.

Figure 3:
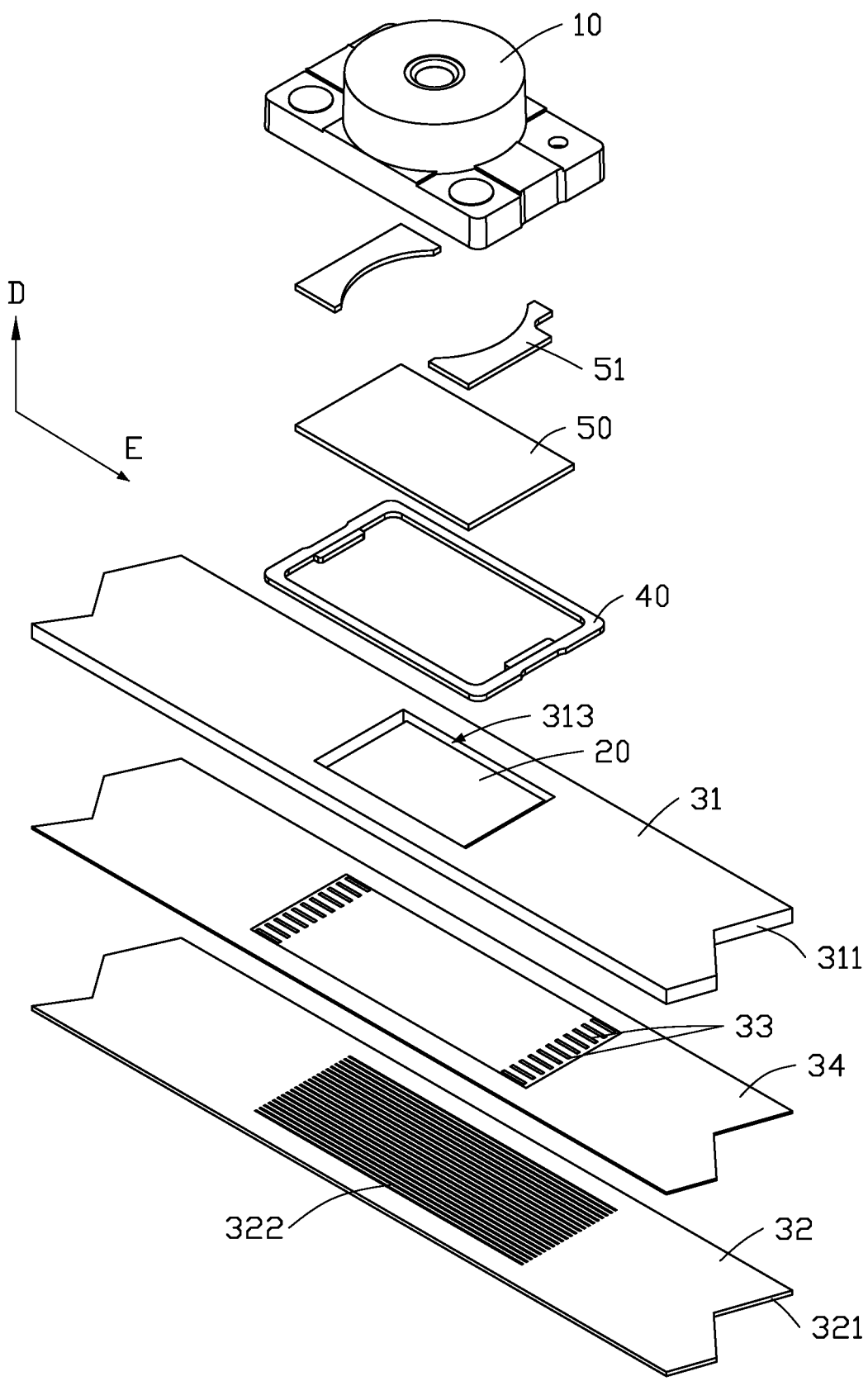
FIG. 3 is an exploded view of the camera module of FIG. 1.

Referring to FIGS. 2 and 3, the circuit board assembly 30 includes a circuit board 31 and a reinforced plate 32 arranged on the circuit board 31. The circuit board 31 includes an insulating plate 311 and a plurality of conductive lines 312. The conductive lines 312 are embedded in the insulating plate 311.

A first direction D is defined as a thickness direction of the circuit board 31, and a second direction E is defined as a lengthwise direction of the circuit board 31. The circuit board 31 defines a through hole 313 along the first direction D. The conductive lines 312 run along the second direction E. The through hole 313 intercepts a portion of the conductive lines 312. The photosensitive chip 20 is disposed within the through hole 313, and the photosensitive chip 20 is connected to the conductive line 312 through wire bonding process. The reinforced plate 32 includes a plate body 321 and a plurality of connecting lines 322. The connecting lines 322 are arranged on the plate body 321. Each connecting line 322 connects to an intercepted conductive line 312. Hence, the sideways dimension (that is, on either side of the chip 20) of the circuit board 31 does not need to be increased, and a minimal height of the camera module 100 is achieved.

In this embodiment, the reinforced plate 32 is made of metallic or non-metallic material, for example, copper and copper alloy, iron and iron alloy, aluminum and aluminum alloy, synthetic resin, ceramics, etc. The insulating plate 311 is made of an insulating resin, such as polypropylene (PP), polyimide (PI), liquid crystal polymer (LCP), polyethylene terephthalate (PET), and polyethylene naphthalate (PEN).

Figure 4:
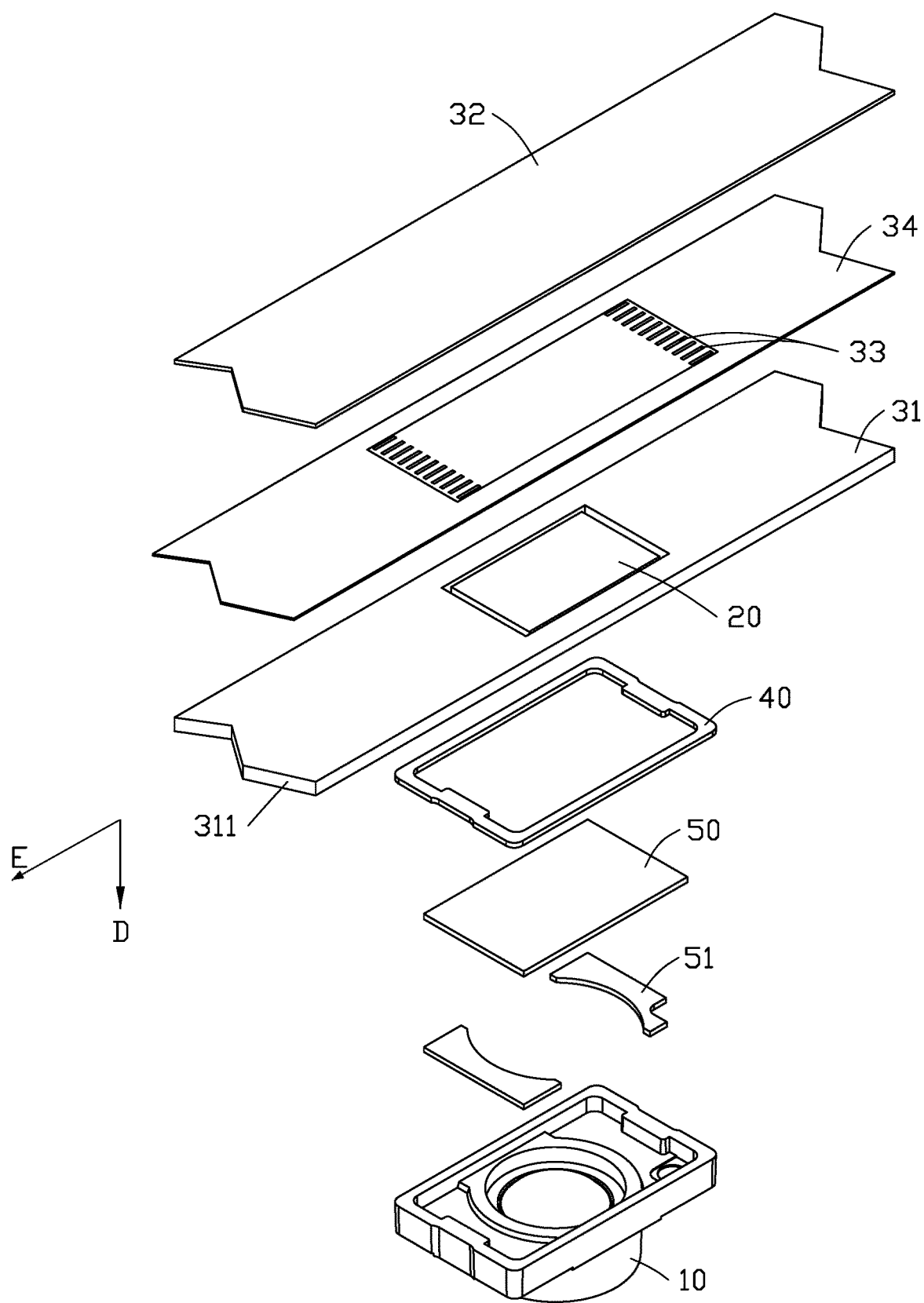
FIG. 4 is an exploded view of the camera module of FIG. 1, viewed from another angle.
Figure 5:
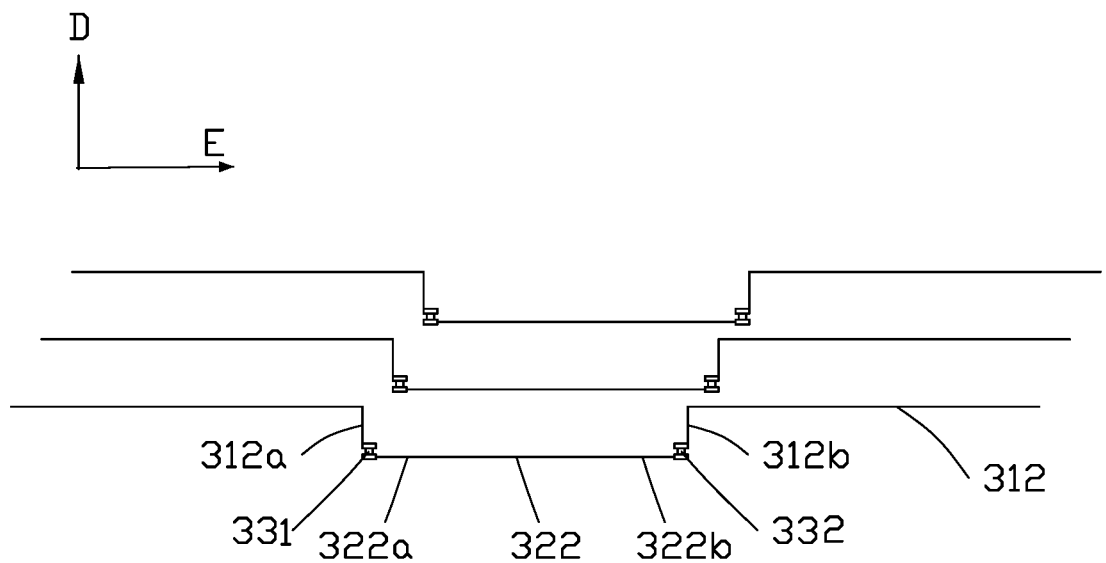
FIG. 5 is a diagrammatic view of conductive lines of the circuit board assembly of FIG. 1.

Referring to FIGS. 3, 4 and 5, in this embodiment, the circuit board assembly 30 further includes a conductive member 33. The conductive member 33 connects the connecting line 322 and conductive line 312. In at least one embodiment, the conductive member 33 includes a first conductive sheet 331 and a second conductive sheet 332. Each intercepted conductive line 312 includes a first end 312a and a second end 312b. The first end 312a and the second end 312b are both exposed from a surface of the insulating plate 311 which faces the reinforced plate 32. Each connecting line 322 includes a third end 322a and a fourth end 322b opposite to the third end 322a. The first end 312a faces the third end 322a, and the second end 312b faces the fourth end 322b. The first conductive sheet 331 electrically connects the first end 312a and the third end 322a, the second conductive sheet 332 electrically connects the second end 312b and the fourth end 322b. The first conductive sheet 331 and the second conductive sheet 332 are made of Anisotropic Conductive Films (ACFs).

Referring to FIGS. 3 and 4. in this embodiment, the circuit board assembly 30 further includes a first adhesive layer 34. The first adhesive layer 34 is disposed between the plate body 321 and the insulating plate 311. The first adhesive layer 34 is used for connecting the circuit board 31 and the enforced plate 32 into an integrated structure.

Referring to FIGS. 3 and 4, in this embodiment, the lens assembly 10 includes a lens barrel 11, a plurality of optical lenses 12, and a second adhesive layer 34. The plurality of optical lenses 12 is disposed within the lens barrel 11. The second adhesive layer 34 is disposed between the lens barrel 11 and the circuit board 31. The second adhesive layer 34 is used for connecting the lens barrel 11 and the circuit board 31 into an integrated structure.

Referring to FIGS. 3 and 4, in this embodiment, the camera module 100 further includes an optical filter 50 and a third adhesive layer 51. The third adhesive layer 51 is disposed around the through hole 313. The optical filter 50 is disposed on the adhesive layer 51. One side of the optical filter 50 faces the through hole 313, and other side of the optical filter 50 faces the plurality of optical lenses 12. In at least one embodiment, the optical filter 50 is an infrared filter to block infrared light.

Figure 6:
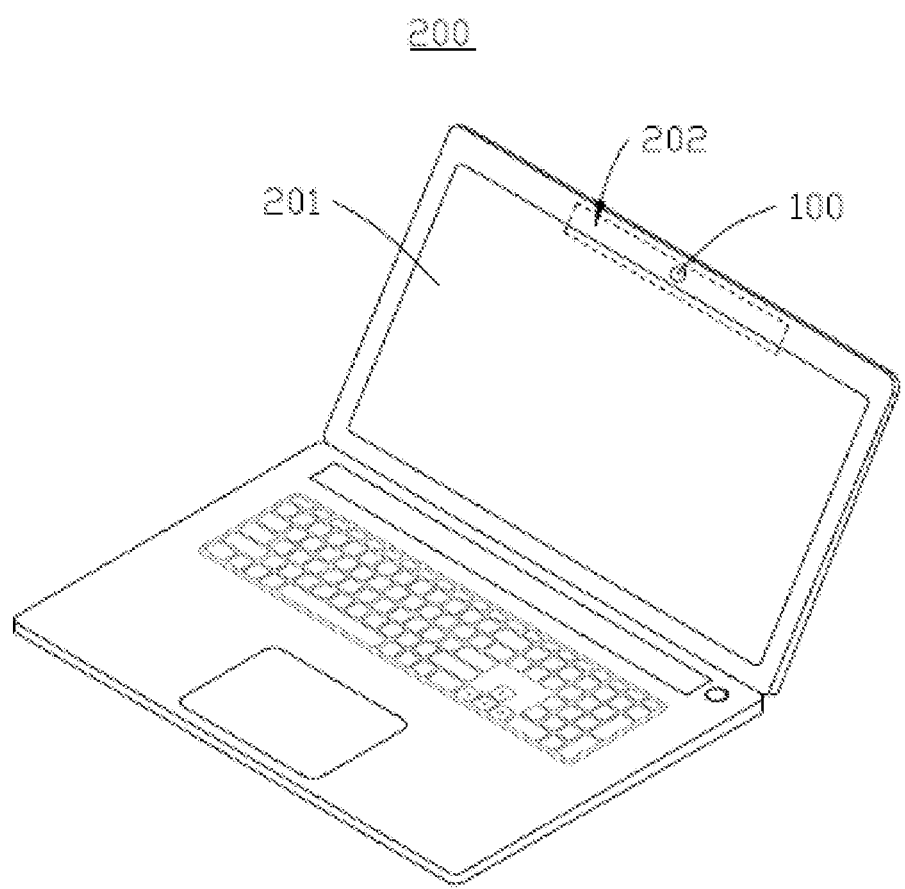
FIG. 6 is a diagrammatic view of an electronic device according to an embodiment of the present disclosure.

Referring to FIGS. 1 and 6, the embodiment also provides an electronic device 200, which includes the camera module 100 and a housing 201. The housing 201 defines an opening 202. The circuit board assembly 30, the photosensitive chip 20, and portion of the lens assembly 10 are arranged in the housing 201. A portion of the lens assembly 10 is exposed from the opening 202. The electronic device 200 can be any device with an image capturing function, such as mobile phone, computer, tablet computer, watch, etc.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board assembly comprising:
a circuit board; and
a reinforced plate connected to the circuit board;
wherein the circuit board comprises a through hole, and a plurality of conductive lines, the through hole cuts off a portion of the plurality of conductive lines, the reinforced plate comprises a plurality of connecting lines, the plurality of connecting lines connects the portion of the plurality of conductive lines which is cut off by the through hole.

2. The circuit board assembly of claim 1, wherein the reinforced plate further comprises a body plate, the plurality of connecting lines is arranged on the body plate and faces the through hole.

3. The circuit board assembly of claim 2, wherein the body plate is made of metal or ceramic.

4. The circuit board assembly of claim 1, wherein the circuit board further comprises an insulating plate, the plurality of conductive lines is arranged in the insulating plate.

5. The circuit board assembly of claim 4, wherein the insulating plate is made of polyimide.

6. The circuit board assembly of claim 1, further comprising a conductive member, wherein the conductive member electrically connects the plurality of connecting lines and the plurality of conductive lines.

7. The circuit board assembly of claim 6, wherein each of the plurality of conductive lines comprises a first end and a second end, each of the plurality of connecting lines comprises a third end and a fourth end, the conductive member comprises a first conductive sheet and a second conducive sheet, the first conductive sheet connects between the first end and the third end, the second conductive sheet connects between the second end and the fourth end.

8. The circuit board assembly of claim 1, further comprising a first adhesive layer, wherein the first adhesive layer connects between the reinforced plate and the circuit board.

9. A camera module comprising: a circuit board assembly; a lens assembly connected to the circuit board assembly; a photosensitive chip connected to the circuit board assembly; wherein the circuit board comprises a through hole, and a plurality of conductive lines, the through hole cuts off a portion of the plurality of conductive lines, a reinforced plate comprises a plurality of connecting lines, the plurality of connecting lines connects the portion of the plurality of conductive lines which is cut off by the through hole; the photosensitive chip is arranged in the through hole, the lens assembly is arranged on a surface of the circuit board, the photosensitive chip faces the lens assembly.

10. The camera module of claim 9, wherein the reinforced plate further comprises a body plate, the plurality of connecting lines is arranged on one surface of the body plate and faces the through hole.

11. The camera module of claim 10, wherein the body plate is made of metal or ceramic.

12. The camera module of claim 9, wherein the circuit board further comprises an insulating plate, the plurality of conductive lines is arranged in the insulating plate.

13. The camera module of claim 12, wherein the insulating plate is made of polyimide.

14. The camera module of claim 9, wherein the circuit board assembly further comprising a conductive member, the conductive member electrically connects the plurality of connecting lines and the plurality of cut-off conductive lines.

15. The camera module of claim 14, wherein each of the plurality of cut-off conductive lines comprises a first end and a second end, each of the plurality of connecting lines comprises a third end and a fourth end, the conductive member comprises a first conductive sheet and a second conducive sheet, the first conductive sheet connects between the first end and the third end, the second conductive sheet connects between the second end and the fourth end.

16. The camera module of claim 9, wherein the circuit board assembly further comprising a first adhesive layer, the first adhesive layer connects between the reinforced plate and the circuit board.

17. The camera module of claim 9, wherein the lens assembly further comprises a lens barrel, a plurality of optical lens, and a second adhesive layer, the plurality of optical lens is arranged within the lens barrel, the second adhesive layer is arranged between the lens barrel and one surface of the circuit board.

18. The camera module of claim 9, further comprises an optical filter, wherein the optical filter is arranged between the lens assembly and the photosensitive chip.

19. An electronic device comprising a camera module, wherein the camera module comprises: a circuit board assembly; a lens assembly connected to the circuit board assembly; a photosensitive chip connected to the circuit board assembly; wherein the circuit board comprises a through hole, and a plurality of conductive lines, the through hole cuts off a portion of the plurality of conductive lines, a reinforced plate comprises a plurality of connecting lines, the plurality of connecting lines connects the portion of the plurality of conductive lines which is cut off by the through hole; the photosensitive chip is arranged within the through hole, the lens assembly is arranged on a surface of the circuit board, the photosensitive chip faces the lens assembly.

20. The electronic device of claim 19, wherein the reinforced plate further comprises a body plate, the plurality of connecting lines is arranged on one surface of the body plate and faces the through hole.

* * * * *